United States Patent [19]

Mizuno et al.

[11] Patent Number: 5,155,092
[45] Date of Patent: Oct. 13, 1992

[54] CERAMIC SUPERCONDUCTING COMPOSITION AND PROCESS AND APPARATUS FOR PREPARING THEREOF

[75] Inventors: Fumio Mizuno; Izumi Hirabayashi, both of Nagoya, Japan

[73] Assignees: NGK Spark Plug Co., Ltd., Aichi; International Superconductivity Technology Center, Tokyo, both of Japan

[21] Appl. No.: 457,634

[22] Filed: Dec. 27, 1989

[30] Foreign Application Priority Data

Dec. 28, 1988 [JP] Japan ................................ 63-328999
Dec. 28, 1988 [JP] Japan ................................ 63-329000

[51] Int. Cl.$^5$ ........................ C04B 35/50; A01B 12/00
[52] U.S. Cl. .................................... 505/1; 505/734; 505/781; 505/778; 505/785; 501/123; 501/126; 501/152; 252/521; 264/65
[58] Field of Search .................... 505/1, 734, 781, 778, 505/785; 501/123, 126, 152; 252/521

[56] References Cited

U.S. PATENT DOCUMENTS

| | | | |
|---|---|---|---|
| 4,202,690 | 5/1980 | Funke | 75/224 |
| 4,490,108 | 12/1984 | Petzi | 432/23 |
| 5,049,542 | 9/1991 | Brass et al. | 505/778 |

FOREIGN PATENT DOCUMENTS

| | | | |
|---|---|---|---|
| 0285319 | 5/1988 | European Pat. Off. | |
| 0308326 | 3/1989 | European Pat. Off. | |
| 3211247 | 10/1983 | Fed. Rep. of Germany | |
| 3223954 | 12/1983 | Fed. Rep. of Germany | |
| 2373096 | 6/1978 | France | |
| 0274618 | 11/1988 | Japan | 505/778 |

OTHER PUBLICATIONS

Sungi et al., "Superconductivity and Magnetism is High-Tc Superconduction ReBa$_2$Cu$_3$O$_{7-x}$ with Rec 4, Dy, Gd, Sm, Nd, and La", Inter. Journ. Med. Phy. B, vol. 1, No. 2, 1987, 425–29.
Jin et al., "Large Magnetic Hysteresis in a multi-textured Y-Ba-Cu-O Superconductor", Appl. Phy. Lett. 54(6), 6 Feb. 1989, 584–86.
Singh et al., "Effect of Silver and Silver Oxide Additions on the Mechanical as Superconducting Properties of YBa$_2$Cu$_3$O$_{7-\delta}$, Superconductors", J. Appl. Phys. 66(7) Oct. 1, 1989, pp. 3154–3159.
Maeda et al., Jap. Jour. Appl. Phy. 26 #8, Aug. 1987, L1368–L1370.
Wada et al., "High Temperature Superconductor LaBa$_2$Cu$_3$O$_{7-\delta}$ with zero resistance at 92K", Appl. Phys. Lett. 52(23), pp. 1989–91 Jun. 1988.
Omori et al., "Preparation of Oriented Orthorhombic Ln Ba$_2$Cu$_3$O$_{7-\delta}$ Polycuptals", Jap. J. Appl. Phys. vol. 26 #8, pp. L1421–L1423 Aug. 1987.
Chaddah et al., "Appl. Phys. Letts.", 52(18), pp. 1525–1527, 2 May 1988.
Wu et al., "High-Temperature Processing of Oxide Superconductors and Superconducting Oxide-Silver Composite", ACS Symp. Ser., 377 Chem. High-Temp. Supercond. 2, (1988) pp. 181–193.
C. U. Segre et al., "Oxygen Ordering and Superconductivity in La(Ba$_{2-x}$LA$_x$)Cu$_3$O$_{7+\delta}$", Nature vol. 329, pp. 227–229, Sep. 17, 1987.
*Werkstoffe & Konstruktion*, 02:3 268–270 (1988).
*Japanese Journal of Applied Physics*, 28:5 780–783 (1989).

(List continued on next page.)

Primary Examiner—William R. Dixon, Jr.
Assistant Examiner—C. Melissa Bonner
Attorney, Agent, or Firm—Sughrue, Mion, Zinn, Macpeak & Seas

[57] ABSTRACT

In a ceramic superconducting composition, Ag2O is added thereto in an amount of 0.1 wt. % to 70 wt. % per mole of LaBa2Cu3O3−δ. The critical current density of the ceramic superconducting composition is affected by heat treatment conditions. The critical electric current density of the ceramic superconducting composition is increased when it is prepared through heat treatment while controlling the partial pressure of oxygen in a heat treatment atmosphere in steps with successive stages including a temperature-elevating step, a sintering step, a temperature-lowering step, and an annealing step.

19 Claims, 5 Drawing Sheets

OTHER PUBLICATIONS

Japanese Journal of Applied Physics, vol. 26, No. 8, Aug. 1987, pp. L1368–L1370, "High Temperature Superconductive at 90 K in Orthorhombic LaBa$_2$CU$_3$O$_y$", Maeda et al.

Physical Review B, vol. 36, No. 4, pp. 2417–2420, "Effect of structural changes on the zero-resistance transition temperature of La$_1$Ba$_2$Cu$_3$O$_{9-\delta}$", Lee et al.

Physical Review Letters, vol. 58, No. 18, pp. 1888–1890, May 4, 1987, "New Superconducting Cuprate Perovskites", Murphy et al.

Applied Physics, vol. 52, No. 23, Jun. 6, 1988, pp. 1989–1991, "High transition temperature superconductor LaBa$_2$Cu$_3$O$_{7-y}$ with zero resistance at 92 K", Wada et al.

Japanese Journal of Applied Physics, vol. 27, No. 6, Jun. 1988, pp. L1101–L1103, "Fracture Toughness Measurements of Ba$_2$YCu$_3$O$_{7-x}$ Superconducting Oxide by Means of Indentation Technique", Ochiai et al.

CERAMIC SUPERCONDUCTING COMPOSITION AND PROCESS AND APPARATUS FOR PREPARING THEREOF

BACKGROUND OF THE INVENTION

1. Field of the Invention

The present invention relates to ceramic superconducting materials, processes for preparing the same, and heat treatment apparatuses for preparing the same. More particularly, the invention relates to a lanthanum-based ceramic superconducting material, a process and an apparatus for preparing the same.

2. Description of the Prior Art

A ceramic superconducting composition represented by the compositional formula: $YBa_2Cu_3O_{7-\delta}$, which is indicative of oxygen insufficiency, is known as a ceramic superconductor having a high superconducting transition temperature. $Y_2O_3$ for use in the preparation of this ceramic superconductor is scarce in mineral resources and hence expensive. Since $La_2O_3$ is more inexpensive than $Y_2O_3$, an $LaBa_2Cu_3O_{7-\delta}$ superconductor, which contains La in place of Y of the above-mentioned $YBa_2Cu_3O_{7-\delta}$, will be of a great industrial value if it can be put into practical use.

However, an $LaBa_2Cu_3O_{7-\delta}$ superconductor having a superconducting transition temperature of 92 K., which has recently been reported in Applied Physics Letters, 52 (23), P. 1989, 1988, is prepared according to a process requiring double calcination at 900° C. and 950° C., sintering at 980° C. for 40 hours, and annealing at 300° C. for 40 hours to give rise to a superconducting phase. Such long hours of the heat treatments present problems of low productivity and poor energy efficiency.

Furthermore, the critical electric current density of the $LaBa_2Cu_3O_{7-\delta}$ superconducting oxide has not been reported yet and the optimum heat treatment conditions for preparation thereof has not been revealed yet as well. Thus, there are problems to be solved before this superconducting material is put into practical use.

The preparation of oxide superconductors, not to mention lanthanum-based oxide superconducting materials, requires a heat treatment process including sintering and annealing to develop a superconducting phase. The superconducting characteristics of oxide superconductors are greatly affected by heat treatment conditions, among which the control of atmospheres in respective heat treatment stages is of particular importance. However, no apparatuses capable of strictly controlling the partial pressure of oxygen in the vicinity of a material being heat-treated in step with successive stages during the course of heat treatment have been proposed to date.

SUMMARY OF THE INVENTION

An object of the present invention is to provide a superconducting composition mainly comprising $LaBa_2Cu_3O_{7-\delta}$, and having a high superconducting transition temperature and a high critical electric current density which can be realized even through heat treatment for a short period of time.

Another object of the present invention is to provide a process for preparing a superconducting composition improved in superconducting characteristics even through heat treatment for a short period of time.

Still another object of the present invention is to provide a heat treatment apparatus capable of controlling the heat treatment atmosphere in step with successive stages during the course of heat treatment so as to enable a material being heat-treated to develop the best characteristics.

A further object of the present invention is to provide a heat treatment apparatus which can be effectively used for the preparation of an oxide superconducting material.

In an aspect of the present invention, a ceramic superconducting composition comprises:

an oxide represented by a formula $LaBa_2Cu_3O_{7-\delta}$ and including $Ag_2O$ in an amount of 0.1 wt. % to 70 wt. % per mole of $LaBa_2Cu_3O_{7-\delta}$.

Here, the amount of $Ag_2O$ may be in the range of 5 wt. % to 70 wt. % per mole of $LaBa_2Cu_3O_{7-\delta}$.

The amount of $Ag_2O$ may be in the range of 10 wt. % to 70 wt. % per mole of $LaBa_2Cu_3O_{7-\delta}$.

The amount of $Ag_2O$ may be in the range of 20 wt. % to 70 wt. % per mole of $LaBa_2Cu_3O_{7-\delta}$.

The amount of $Ag_2O$ may be in the range of 20 wt. % to 25 wt. % per mole of $LaBa_2Cu_3O_{7-\delta}$.

In another aspect of the present invention, a process for preparing a ceramic superconducting composition comprising the steps of:

elevating the temperature of a ceramic superconducting composition;
sintering the composition;
lowering the temperature of the composition; and
annealing the composition;
while controlling the partial pressure of oxygen in the vicinity of the composition in the respective steps.

Here, the ceramic superconducting composition may comprise $LaBa_2Cu_3O_{7-\delta}$ and $Ag_2O$ added thereto in an amount of 0.1 wt. % to 70 wt. % per mole of $LaBa_2Cu_3O_{7-\delta}$.

$Ba(OH)_2 \cdot 8H_2O$ may be used as the starting Ba material of the composition.

The partial pressures of oxygen respectively in the temperature-elevating step and the sintering step may be each at most 20%, while the partial pressures of oxygen respectively in the temperature-lowering step and the annealing step are each at least 70%.

The partial pressures of oxygen respectively in the temperature-lowering step and the annealing step may be 100%.

The partial pressure of oxygen in the sintering step may be 0%.

The partial pressures of oxygen respectively in the temperature-elevating step, the sintering step, the temperature-lowering step and the annealing step may be all 20%.

In still another aspect of the present invention, a heat treatment apparatus for preparing a ceramic superconducting composition comprises:

a heat treatment furnace;
a heating means for heating a material disposed in the heat treatment furnace and to be heat-treated;
a temperature control means for controlling the heating means in such a way as to change the temperature of the above-mentioned material in accordance with a predetermined time versus temperature profile;
a gas feeding means for feeding an oxygen gas and an inert gas into the heat treatment furnace;
a gas pressure control means for controlling the gas pressure inside the heat treatment furnace to a predetermined level;

an oxygen detection means for detecting the amount of oxygen in the vicinity of the material; and gas flow rate control means for controlling the flow rate of the oxygen gas and the flow rate of the inert gas in such a way as to set the partial pressure of oxygen in the vicinity of the material at a predetermined level on the basis of the result of detection by the oxygen detection means, the gas flow rate control means being capable of preliminarily memorizing a predetermined partial-pressure-of-oxygen versus time profile.

The above and other objects, effects, features and advantages of the present invention will become more apparent from the following description of embodiments thereof taken in conjunction with the accompanying drawings.

DETAILED DESCRIPTION OF PREFERRED EMBODIMENTS

The following examples will now illustrate the present invention in detail by reference to the accompanying drawings.

$La_2O_3$, $Ba(OH)_2 \cdot 8H_2O$ and $CuO$ each in a dry state were weighed and mixed and pulverized at an La:Ba:Cu ratio of 1:2:3. The resulting powdery mixture was heat-treated at 800° to 900° C. for 10 hours. Such a heat treatment may be effected in any atmosphere selected from air, oxygen and nitrogen. The heat-treated mixture was pulverized again and passed through a 30 μm sieve to obtain an $LaBa_2Cu_3O_{7-\delta}$ powder.

$BaCO_3$ is usually used as a starting Ba material. The use of $BaCO_3$ as the starting Ba material results in carbonate groups remaining even after a heat treatment at 900° to 950° C. and causing to shift the resultant composition away from the intended one. In view of this, highly reactive $Ba(OH)_2 \cdot 8H_2O$ free of carbonate groups was used as the starting Ba material in the present invention. For comparison, however, a sample was prepared using $BaCO_3$ as the starting Ba material.

The $LaBa_2Cu_3O_{7-\delta}$ powder thus obtained was admixed with a predetermined amount of an $Ag_2O$ powder (purity: 99.99%), followed by formation therefrom of a pellet of 15 mm in diameter and 1.5 mm in thickness under a pressure of 1 to 2 tons/cm². The above-mentioned predetermined amount of the $Ag_2O$ powder was varied within the range of 0 to 70 wt. % per mole of $LaBa_2Cu_3O_{7-\delta}$ powder to prepare a plurality of pellets. Each of the pellets was placed in a crucible and heat-treated while controlling the temperature and total pressure of a heating atmosphere and the partial pressure of oxygen in the heating atmosphere.

Figure 1:
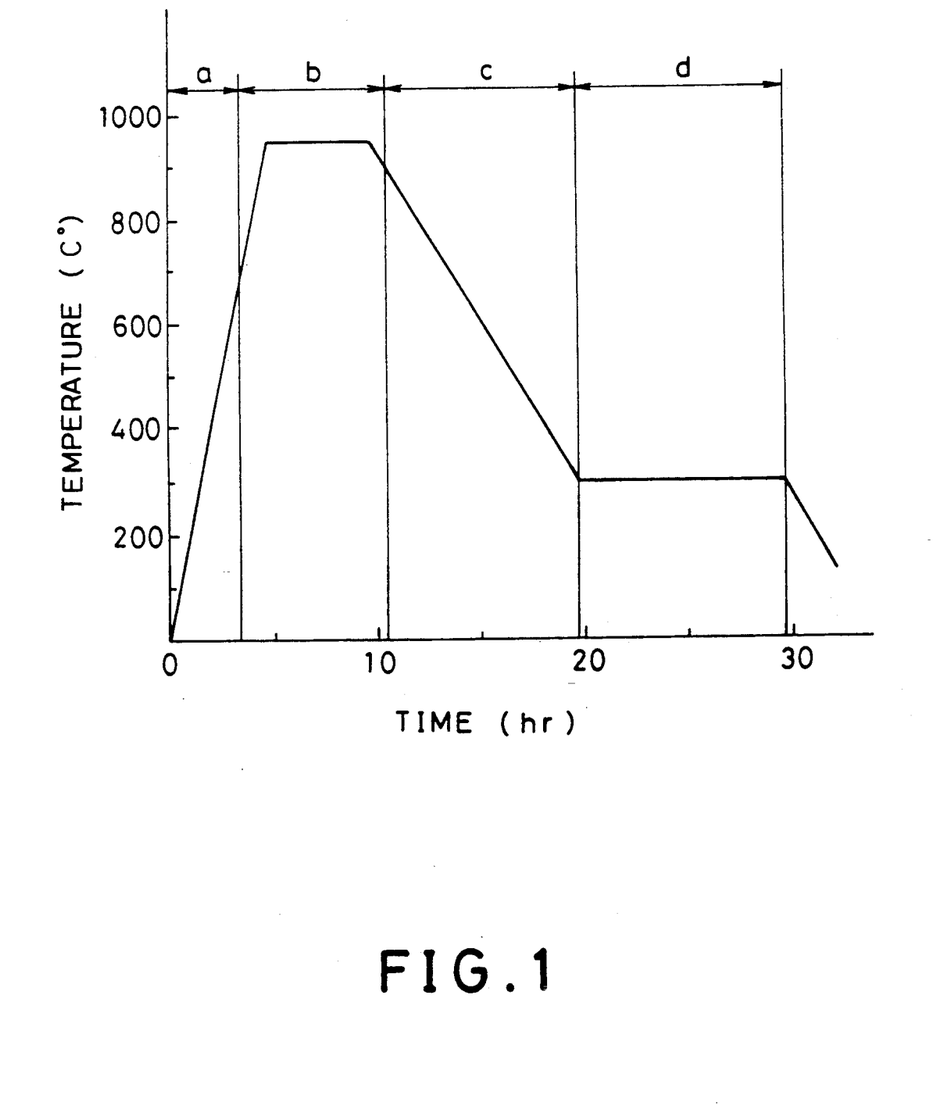
FIG. 1 is a diagram illustrative of the heat treatment process of the present invention.

FIG. 1 shows an example of the time versus temperature profile during the course of heat treatment. As shown in FIG. 1, the heat treatment process comprises four steps consisting of the step (a) of elevating the temperature up to a sintering temperature, the step (b) of sintering at the constant temperature, the step (c) of lowering the temperature down to an annealing temperature, and the step (d) of annealing at the constant temperature for developing a superconducting phase.

In the following examples, the temperature-elevating rate and the temperature-lowering rate were kept constant at 200° C./hr and 60° C./hr, respectively. The sintering temperature was arbitrarily chosen from within the range of 900° C. to 980° C., while the sintering time was set to be 5 hours for all runs. The annealing temperature was set to be 300° C. for all runs, while the annealing time was set to be 5 hours or 10 hours.

As shown in FIG. 1, the heat treatment process was divided into four segments (a), (b), (c) and (d), in step with which the atmosphere was controlled during the course of heat treatment. The segment (a) corresponds to a stage of elevating the temperature up to 700° C. The segment (b) comprises a stage of elevating the temperature above 700° C., the central step of sintering, and a stage of lowering the temperature down to 900° C. The segment (c) corresponds a stage of lowering the temperature from 900° C., while the segment (d) corresponds to the step of annealing for developing the superconducting phase. According to the present invention, the total pressure inside the heat treatment furnace was controlled while at the same time the partial pressure of oxygen was controlled in step with the successive segments through detection of the partial pressure of oxygen in the vicinity of the pellet being heat-treated. In the foregoing manner, samples differing in the amount of $Ag_2O$ added thereto were prepared through heat treatment.

Figure 2:
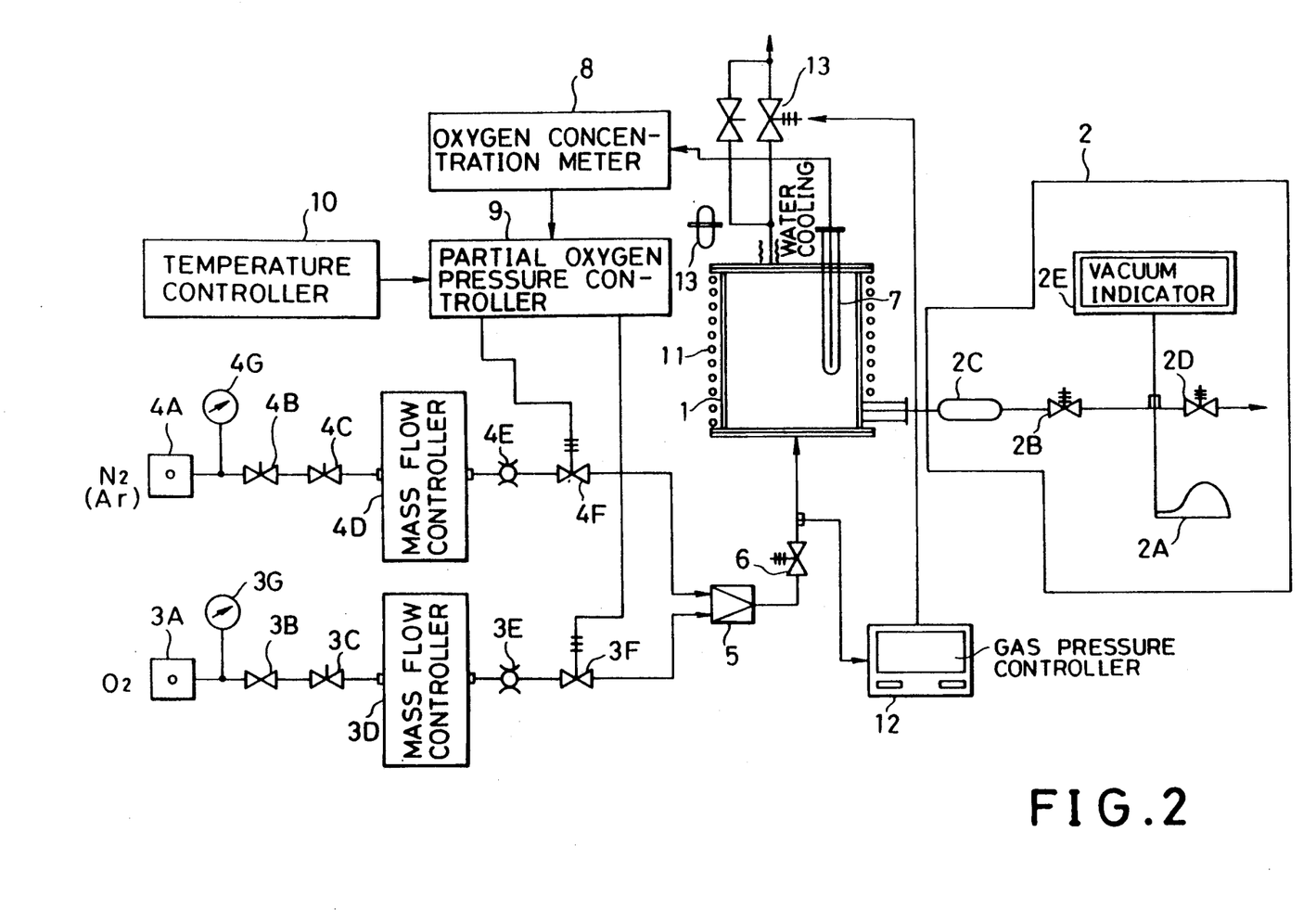
FIG. 2 is a schematic diagram of the heat treatment apparatus of the present invention.

FIG. 2 diagrammatically shows an apparatus used for effecting the foregoing heat treatment. A heat treatment furnace 1 is first evacuated to a predetermined degree of vacuum with a pumping system 2 including a rotary pump 2A, an electromagnetic vacuum valve 2B, an air filter 2C, a leak valve 2D and a vacuum indicator 2E. Subsequently, a mixed gas of oxygen and nitrogen (or argon) is fed into the heat treatment furnace 1. Oxygen is fed from a cylinder 3A through a stop valve 3B, a needle valve 3C, a mass flow controller 3D, a chuck valve 3E and a control valve 3F into a gas mixer 5. Likewise, nitrogen (or argon) is fed from a cylinder 4A through a stop valve 4B, a needle valve 4C, a mass flow controller 4D, a chuck valve 4E and a control valve 4F into the gas mixer 5. Oxygen and nitrogen (or argon) are mixed with each other in the gas mixer 5. A mixed gas (or a single gas) is passed through a gas feed valve 6 and guided into the heat treatment furnace 1. The pressures of the gases guided from the respective cylinders 3A and 4A to the respective stop valves 3B and 4B are detected with primary pressure gauges 3G and 4G, respectively. An oxygen sensor 7 is disposed in the vicinity of a material being heat-treated inside the heat treatment furnace 1 to detect the amount of oxygen in the vicinity of the material being heat-treated. A signal detected is input to an oxygen concentration meter 8, from which the signal of oxygen concentration is then input to a partial oxygen pressure controller 9. The partial pressures of oxygen respectively predetermined for the aforementioned segments are memorized in a temperature controller 10 for controlling the temperature inside the heat treatment furnace 1 through control of an electric current flowing through a resistance heating element 11. The above-mentioned predetermined partial pressures of oxygen are compared with the signal of oxygen concentration from the oxygen concentration meter 8 by means of the partial oxygen pressure controller 9, which then controls the partial pressure of oxygen in the vicinity of the material being heat-treated to a predetermined value through opening or closing of the control valves 3F and 4F. Drawing of a termocouple for measuring the temperature inside the heat treatment furnace 1 is omitted from FIG. 2.

A signal of the pressure of the gas fed into the heat treatment furnace 1 is input to a gas pressure controller 12, which operates an exhaust valve 13 in such a way as to keep the pressure inside the heat treatment furnace 1 at a predetermined level. When the pressure inside the heat treatment furnace 1 happens to become excessively high, a safety valve 14 is operated to prevent any damage to the heat treatment furnace 1 from occurring. The body of the heat treatment furnace 1 is capable of being cooled with water.

The various samples prepared using the apparatus as shown in FIG. 2 were examined with respect superconducting transition temperature and critical electric current density and subjected to an analysis of crystal structure through X-ray diffractmetry. The superconducting transition temperature $T_C$(end), at which the electric resistance of each sample falls down to zero, was determined using a four probe method of measuring the DC resistance of the sample. The superconducting transition temperature TcI of each sample was determined from the variation of the AC susceptibility of the sample with temperature which was examined using a hartshorn bridge. The maximum value of electric current, at which the superconducting state of each sample placed deep in liquid nitrogen was maintained when a large electric current pulse was flowed through the sample, was determined. This maximum value of electric current was used to find the critical current density $J_C$ of the sample.

The superconducting transition temperatures Tc(end) and TcI and the critical current densities of the various samples prepared by varying the $Ag_2O$ concentration and the heat treatment conditions are shown in Table 1, in which the total pressures in the furnace are listed using atmospheric pressure as a standard and Sample No. 42 with a mark of * refers to a sample prepared using $BaCO_3$ as the starting Ba material.

Figure 3:
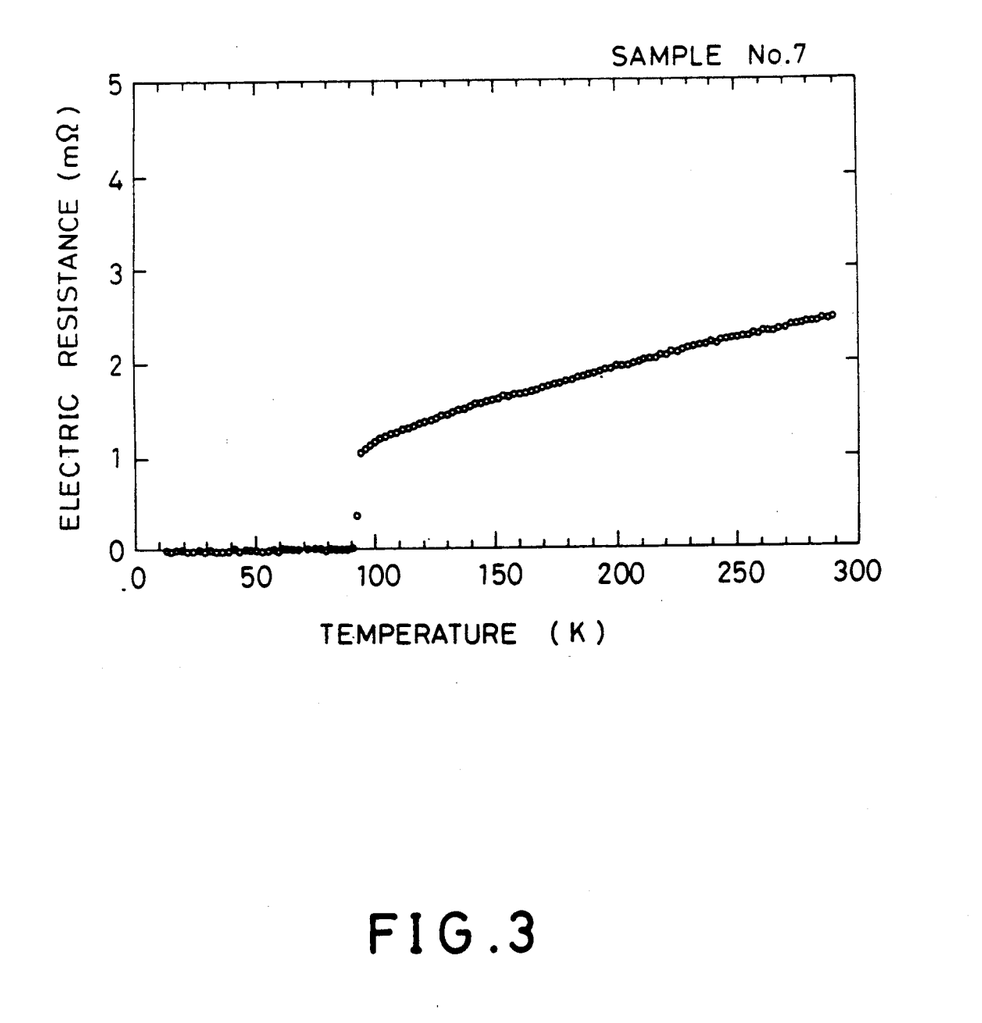
FIG. 3 is a diagram showing the electric resistance versus temperature characteristic curve of an example of the ceramic superconducting composition of the present invention.
Figure 4:
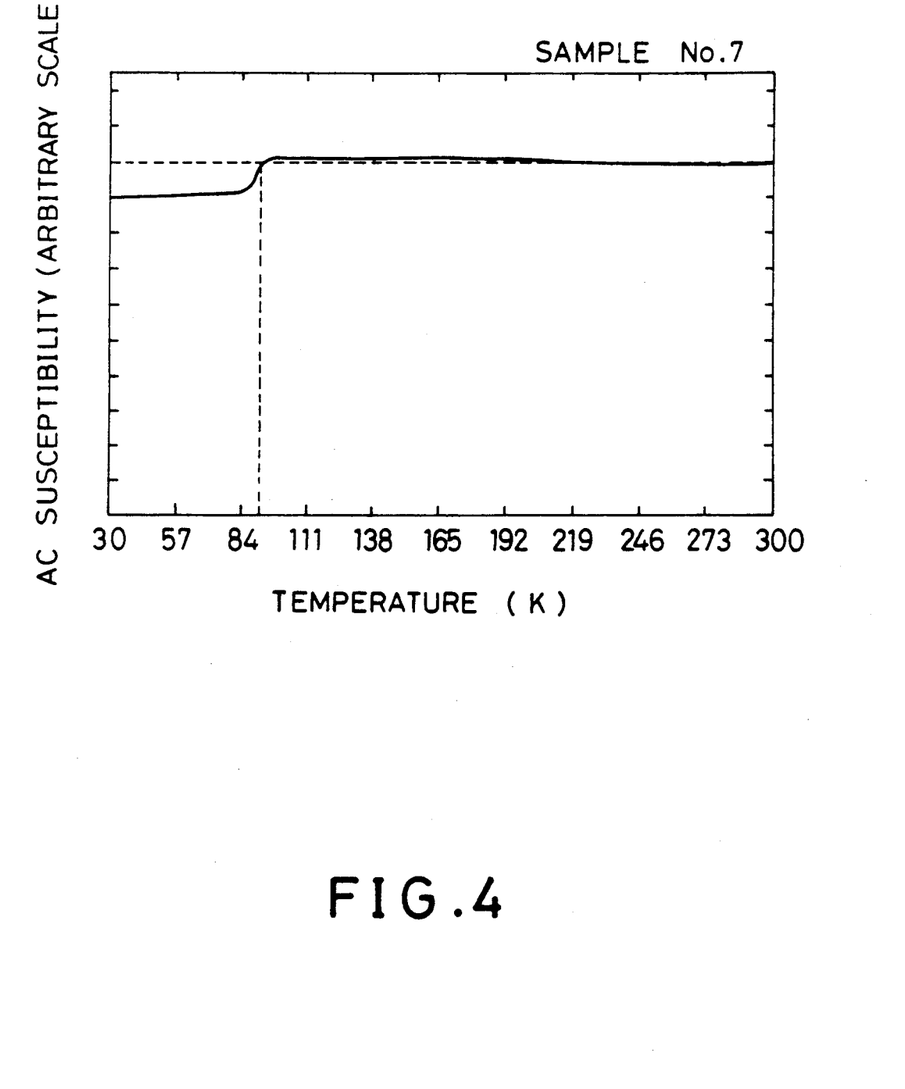
FIG. 4 is a diagram showing the AC susceptibility versus temperature characteristic curve of an example of the ceramic superconducting composition of the present invention.

By way of example, FIGS. 3 and 4 show the electric resistance versus temperature characteristic curve and the AC susceptibility versus temperature characteristic curve of Sample No. 7.

TABLE 1

| Sample No. | Amount by wt. % of Ag per mol of $LaBa_2Cu_3O_7$-δ | Partial Pressure of Oxygen in Furnace (%) | | | | Total Pressure in Furnace (kg/cm$^2$) | Critical Temperature | | Critical Current Density Jc(A/cm$^2$) (at 77K) | Sintering Temperature (°C.) | Annealing Time (hrs) |
|---|---|---|---|---|---|---|---|---|---|---|---|
| | | a | b | c | d | e | Tc (end) (K.) | TcI (K.) | | | |
| 1 | 0.1 | 20 | 0 | 100 | 100 | 1.2 | 89 | 89 | 25 | 960 | 10 |
| 2 | 0.5 | 20 | 0 | 100 | 100 | 1.2 | 90 | 90 | 18 | 960 | 10 |
| 3 | 1.0 | 20 | 0 | 100 | 100 | 1.2 | 88 | 88 | 15 | 950 | 10 |
| 4 | 2.0 | 20 | 0 | 100 | 100 | 1.2 | 91 | 90 | 17 | 950 | 10 |
| 5 | 3.0 | 20 | 0 | 100 | 100 | 1.2 | 92 | 92 | 50 | 950 | 10 |
| 6 | 5.0 | 20 | 0 | 100 | 100 | 1.2 | 90 | 91 | 55 | 950 | 10 |
| 7 | 10.0 | 20 | 0 | 100 | 100 | 1.2 | 86 | 87 | 167 | 950 | 10 |
| 8 | 15.0 | 20 | 0 | 100 | 100 | 1.2 | 88 | 89 | 260 | 950 | 10 |
| 9 | 20.0 | 20 | 0 | 100 | 100 | 1.2 | 87 | 88 | 390 | 950 | 10 |
| 10 | 25.0 | 20 | 0 | 100 | 100 | 1.2 | 90 | 90 | 355 | 940 | 10 |
| 11 | 30.0 | 20 | 0 | 100 | 100 | 1.2 | 92 | 92 | 270 | 940 | 10 |
| 12 | 50.0 | 20 | 0 | 100 | 100 | 1.2 | 93 | 92 | 280 | 940 | 10 |
| 13 | 70.0 | 20 | 0 | 100 | 100 | 1.2 | 90 | 91 | 250 | 950 | 10 |
| 14 | 100.0 | 20 | 0 | 100 | 100 | 1.2 | Fused with Crucible | — | | 950 | 10 |
| 15 | 150.0 | 20 | 0 | 100 | 100 | 1.2 | Fused with Crucible | | | 950 | 10 |
| 16 | 200.0 | 20 | 0 | 100 | 100 | 1.2 | Fused with Crucible | | | 950 | 10 |
| 17 | 10.0 | 20 | 20 | 20 | 20 | 1.0 | 82 | 83 | 180 | 950 | 5 |
| 18 | 20.0 | 20 | 20 | 20 | 20 | 1.0 | 86 | 86 | 228 | 950 | 5 |
| 19 | 70.0 | 20 | 20 | 20 | 20 | 1.0 | 90 | 90 | 230 | 950 | 5 |
| 20 | 10.0 | 20 | 100 | 100 | 100 | 1.2 | 83 | 84 | 70 | 950 | 10 |
| 21 | 20.0 | 20 | 100 | 100 | 100 | 1.2 | 83 | 83 | 62 | 950 | 10 |
| 22 | 70.0 | 20 | 100 | 100 | 100 | 1.2 | 83 | 84 | 60 | 940 | 10 |
| 23 | 10.0 | 100 | 0 | 50 | 20 | 1.2 | 86 | 87 | 60 | 950 | 10 |
| 24 | 20.0 | 100 | 0 | 50 | 20 | 1.2 | 80 | 81 | 70 | 950 | 10 |
| 25 | 70.0 | 100 | 0 | 50 | 20 | 1.2 | 87 | 88 | 50 | 940 | 10 |
| 26 | 10.0 | 0 | 0 | 100 | 100 | 1.0 | 90 | 90 | 170 | 950 | 10 |
| 27 | 20.0 | 0 | 0 | 100 | 100 | 1.0 | 90 | 90 | 200 | 950 | 10 |
| 28 | 70.0 | 0 | 0 | 100 | 100 | 1.0 | 70 | 90 | 219 | 950 | 10 |
| 29 | 10.0 | 0 | 0 | 20 | 40 | −0.7 | Insulator | | | 930 | 10 |
| 30 | 20.0 | 0 | 0 | 20 | 40 | −0.7 | Insulator | | | 930 | 10 |
| 31 | 70.0 | 0 | 0 | 20 | 40 | −0.7 | Insulator | | | 920 | 10 |
| 32 | 10.0 | 0 | 0 | 70 | 70 | −0.5 | 86 | 87 | 201 | 920 | 10 |
| 33 | 20.0 | 0 | 0 | 70 | 70 | −0.5 | 88 | 88 | 192 | 930 | 10 |
| 34 | 70.0 | 0 | 0 | 70 | 70 | −0.5 | 90 | 90 | 230 | 920 | 10 |
| 35 | 0 | 20 | 0 | 100 | 100 | 1.2 | 90 | 90 | 25 | 970 | 10 |
| 36 | 0 | 20 | 20 | 20 | 20 | 1.0 | Insulator | | | 950 | 5 |
| 37 | 0 | 20 | 100 | 100 | 100 | 1.2 | Insulator | | | 950 | 10 |
| 38 | 0 | 100 | 0 | 50 | 20 | 1.2 | Insulator | | | 950 | 10 |
| 39 | 0 | 0 | 0 | 100 | 100 | 1.0 | 72 | 72 | | 950 | 15 |
| 40 | 0 | 0 | 0 | 20 | 40 | −0.7 | 60 | 61 | | 930 | 15 |

TABLE 1-continued

| Sample No. | Amount by wt. % of Ag per mol of $LaBa_2Cu_3O_{7-\delta}$ | Partial Pressure of Oxygen in Furnace (%) a | b | c | d | Total Pressure in Furnace (kg/cm²) e | Critical Temperature Tc (end) (K.) | TCI (K.) | Critical Current Density Jc(A/cm²) (at 77K) | Sintering Temperature (°C.) | Annealing Time (hrs) |
|---|---|---|---|---|---|---|---|---|---|---|---|
| 41 | 0 | 0 | 0 | 70 | 70 | −0.5 | 62 | 62 | | 920 | 15 |
| *42 | 0 | 20 | 0 | 100 | 100 | 1.2 | 82 | 82 | 11 | 970 | 40 |

As can be seen in Table 1, the critical current density Jc varies depending on the amount of $Ag_2O$ added and the heat treatment conditions. The critical current density Jc increases with an increase in the amount of $Ag_2O$ added if heat treatment is effected under suitable conditions. More specifically, the critical current densities Jc of samples respectively containing 5 wt. %, 10 wt. % and 15 wt. %, per mole of $LaBa_2Cu_3O_{7-\delta}$, of $Ag_2O$ added thereto were increased to at least 50 A/cm², at least 100 A/cm² and at least 200 A/cm², respectively, while the critical current density Jc of a sample containing 20 wt. %, per mole of $LaBa_2Cu_3O_{7-\delta}$, of $Ag_2O$ added thereto reached a high level of 390 A/cm². Further addition of $Ag_2O$ in an amount exceeding 20 wt. % per mole of $LaBa_2Cu_3O_{7-\delta}$ resulted in a decrease in the critical current density Jc, which was, however, maintained at a high level of at least 200 A/cm² until the amount of $Ag_2O$ added reached 70 wt. % per mole $LaBa_2Cu_3O_{7-\delta}$. The values of 390 A/cm² and 280 A/cm² as the critical current densities Jc of Sample Nos. 9 and 12, respectively, are more than 20 times that of Sample No. 42 which is a conventional superconductor prepared using $BaCO_3$ as the starting Ba material and containing no $Ag_2O$ added thereto, and more than 10 times that of Sample No. 35 which exhibited the highest critical current density of 25 A/cm² among those samples prepared using $Ba(OH)_2 \cdot 8H_2O$ as the starting Ba material but containing no $Ag_2O$ added thereto. The superconducting transition temperatures of the samples improved in Jc by addition of $Ag_2O$ were around 90 K., demonstrating that no notable decrease in superconducting transition temperature occurred by addition of $Ag_2O$.

Figure 5:
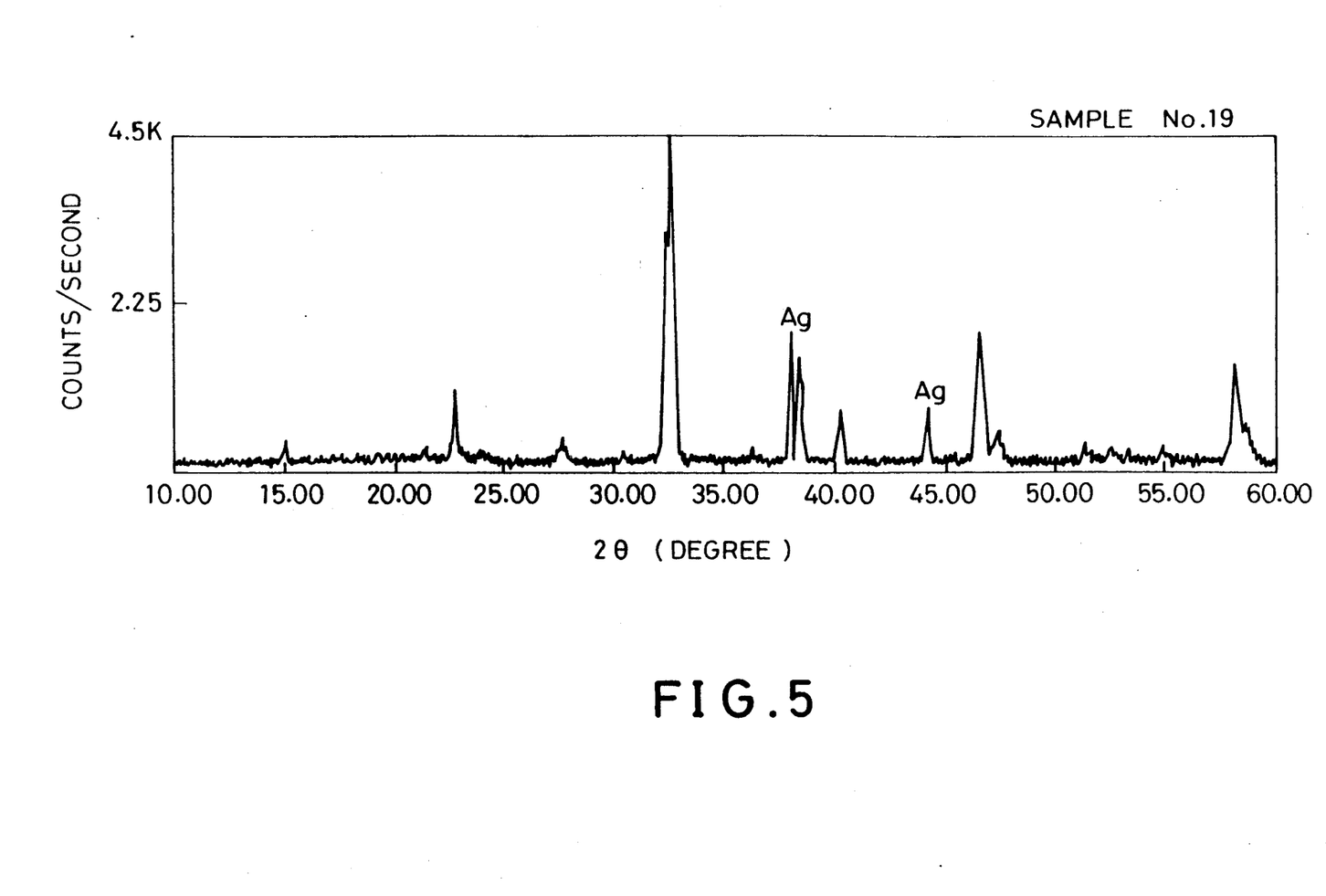
FIG. 5 is a diagram showing the X-ray diffraction pattern of an example of the ceramic superconducting composition of the present invention.

Addition of 0.1 wt. % $Ag_2O$ enabled sintering to be effected at a low temperature and caused no change in Jc as compared with no addition of $Ag_2O$. When the amount of $Ag_2O$ added exceeded 70 wt. % per mole of $LaBa_2Cu_3O_{7-\delta}$, metallic silver precipitated on the surface of a ceramic pellet to fuse with a crucible during heat treatment, with the result that a difficulty was experienced in preparing a sample. Addition of more than 70 wt. % $Ag_2O$ is not preferable from the economical point of view. It is presumed that a small amount of $Ag_2O$ may form a solid solution with $LaBa_2Cu_3O_{7-\delta}$, while most of $Ag_2O$ precipitates in the form of metallic silver. FIG. 5 is a diagram showing the X-ray diffraction pattern of Sample No. 19 containing 70 wt. %, per mole of $LaBa_2Cu_3O_{7-\delta}$, of $Ag_2O$ added thereto. In FIG. 5, strong peaks assigned to metallic silver are seen together with peaks assigned to rhombic $LaBa_2Cu_3O_{7-\delta}$.

The critical current density Jc varies depending on heat treatment conditions, particularly on the partial pressures of oxygen respectively in the aforementioned successive segments. Table 2 is a summary of data for the samples respectively containing 10 wt. %, 20 wt. % and 70 wt. %, per mole of $LaBa_2Cu_3O_{7-\delta}$, of $Ag_2O$ added thereto, which data were extracted from Table 1.

TABLE 2

| Partial Pressure of Oxygen (%) | | | | Total Pressure in Furnace (kg/cm²) | Critical Current Density Jc(A/cm²) (at 77K) | | |
|---|---|---|---|---|---|---|---|
| a | b | c | d | e | $Ag_2O$ 10 wt. % per mol of $LaBa_2Cu_3O_7$-δ | $Ag_2O$ 20 wt. % per mol of $LaBa_2Cu_3O_7$-δ | $Ag_2O$ 70 wt. % per mol of $LaBa_2Cu_3O_7$-δ |
| 20 | 0 | 100 | 100 | 1.2 | 167 | 390 | 250 |
| 20 | 20 | 20 | 20 | 1.0 | 180 | 228 | 230 |
| 0 | 0 | 100 | 100 | 1.0 | 170 | 200 | 219 |
| 0 | 0 | 70 | 70 | −0.5 | 201 | 192 | 230 |
| 20 | 100 | 100 | 100 | 1.2 | 70 | 62 | 60 |
| 100 | 0 | 50 | 20 | 1.2 | 60 | 70 | 50 |
| 0 | 0 | 20 | 40 | −0.7 | — | — | — |

It will be understandable from Table 2 that even heat-treated ceramics containing the same amount of $Ag_2O$ added thereto greatly vary in critical current density Jc, depending on the heat treatment conditions. The critical current density Jc is not so much affected by the total pressure in the furnace. A factor having a great influence on the critical current density Jc is the partial pressures of oxygen respectively in the aforementioned successive segments. Samples prepared by heat treatment under conditions involving a partial pressure of oxygen of 0% in both the segments (a) and (b) and partial pressures of oxygen of 20% and 40% in the segments (c) and (d), respectively, were insulators, whereas samples prepared by heat treatment under conditions involving partial pressures of oxygen of at most 20% in the segments (a) and (b) and partial pressures of oxygen of at least 70% in the segments (c) and (d), or partial pressures of oxygen of at least 20% in all of the segments were improved to exhibit a critical current density Jc of 160 A/cm² to 390 A/cm². Thus, it will be understood that, when the partial pressure of oxygen in the vicinity of a material being heat-treated is controlled in step with successive segments during the course of heat treatment, the critical current density Jc of the heat-treated material can be improved even by shortened hours of heat treatment. The superconducting transition temperatures Tc(end) and TcI are not greatly affected by the partial pressure of oxygen.

Referring to Table 1 again, Sample No. 42 prepared using $BaCO_3$ as the starting Ba material according to the conventional process will be compared with Sample No. 35 prepared using $Ba(OH)_2 \cdot 8H_2O$ as the starting Ba material under the same heat treatment conditions as in the case of Sample No. 42 except for the annealing time. Although the annealing time was as long as 40 hours in the case of Sample No. 42, Sample No. 35 was superior in superconducting transition temperatures Tc(end) and TcI as well as critical current density Jc to Sample No. 42. This will substantiate the supremacy of $Ba(OH)_2 \cdot 8H_2O$ as the starting Ba material over $BaCO_3$.

It will be obvious to those skilled in the art that the process of the present invention can also be widely applied to the preparation of oxide superconductors other than $LaBa_2Cu_3O_{7-\delta}$ and $Ag_2O$-added $LaBa_2Cu_3O_{7-\delta}$.

As described above, according to the present invention, addition of $Ag_2O$ to the superconducting material $LaBa_2Cu_3O_{7-\delta}$ can improve the critical current density Jc thereof despite a short heat treatment time. Furthermore, according to the present invention, control of the partial pressure of oxygen in the vicinity of a material being heat-treated in step with successive stages during the course of heat treatment can improve the superconducting characteristics of the resultant superconducting composition.

The superconducting composition of the present invention can be used in superconducting magnets, a wide variety of superconducting devices, and power storage utilizing super conductivity.

The heat treatment apparatus of the present invention can be utilized in heat treatment of various ceramic material compositions requiring control of the partial pressure of oxygen in addition to the preparation of oxide superconductors.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A ceramic superconducting composition consisting essentially of:
   an oxide represented by a formula $LaBa_2Cu_3O_{7-\delta}$ and including $Ag_2O$, wherein said $Ag_2O$ in said oxide is present in the range of 10 to 70% by weight per mole of $LaBa_2Cu_3O_{7-\delta}$ being represented by 100.

2. A ceramic superconducting composition as claimed in claim 1, wherein said $Ag_2O$ in said oxide is present in the range of 20 to 70% by weight per mole of $LaBa_2Cu_3O_{7-\delta}$ being represented by 100.

3. A ceramic superconducting composition as claimed in claim 1, wherein said $Ag_2O$ in said oxide is present in the range of 20 to 25% by weight per mole of $LaBa_2Cu_3O_{7-\delta}$ being represented by 100.

4. A process for preparing a ceramic superconducting composition comprising the steps of:
   a) mixing a ceramic superconducting powder of an oxide represented by a formula $LaBa_2Cu_3O_{7-\delta}$ with a silver oxide powder to obtain a silver-containing mixture;
   b) elevating to a first temperature of from 900° C. to 980° C. said silver-containing mixture at a temperature-elevating rate of 200° C. per hour;
   c) sintering said silver-containing mixture at said first temperature;
   d) lowering said first temperature to a second temperature of 300° C. said silver-containing mixture at a temperature-lowering rate of 60° C. per hour; and
   e) annealing said silver-containing mixture at said second temperature to obtain a ceramic superconducting oxide composition;
   while controlling the partial pressure of oxygen in the vicinity of said silver-containing mixture in said respective steps.

5. A process as claimed in claim 4, wherein said ceramic superconducting oxide composition consists essentially of $LaBa_2Cu_3O_{7-\delta}$ and $Ag_2O$ added thereto such that said $Ag_2O$ in said oxide is present in the range of 10 to 70 percent by weight per mole of said $LaBa_2Cu_3O_{7-\delta}$ being represented by 100.

6. A process as claimed in claim 5, wherein $Ba(OH)_2 \cdot 8H_2O$ is used as the starting Ba material of said composition.

7. A process as claimed in claim 5, wherein the partial pressures of oxygen respectively in said temperature-elevating step and said sintering step are each at most 20%, while the partial pressures of oxygen respectively in said temperature-lowering step and said annealing step are each at least 70%.

8. A process as claimed in claim 7, wherein the partial pressures of oxygen respectively in said temperature-lowering step and said annealing step are 100%.

9. A process as claimed in claim 8, wherein the partial pressure of oxygen in said sintering step is 0%.

10. A process as claimed in claim 5, wherein the partial pressure of oxygen, respectively, in said temperature-elevating step, said sintering step, said temperature-lowering step, and said annealing step are each 20%.

11. A ceramic superconducting composition consisting essentially of:
    an oxide represented by a formula $LaBa_2Cu_3O_{7-\delta}$ and $Ag_2O$, wherein the weight ratio of said $Ag_2O$ to said $LaBa_2Cu_3O_{7-\delta}$ is in the range of 0.1 to 0.7.

12. A ceramic superconducting composition as claimed in claim 11, wherein the weight ratio is in the range of 0.15 to 0.7.

13. A process for preparing a ceramic superconducting composition comprising the steps of:
    a) mixing ceramic superconducting powder and silver oxide powder to form a silver-conducting composition, wherein the content of silver oxide in said composition is within the range of 10 to 70% by weight per mole of said ceramic superconducting powder;
    b) elevating to a first temperature of from 900° C. to 980° C. said silver-containing composition at a temperature-elevating rate of 200° C. per hour;
    c) sintering said silver-containing composition at said first temperature; and
    d) lowering said first temperature to a second temperature of 300° C. said silver-containing composition at a temperature-lowering rate of 60° C. per hour;
    e) annealing said silver containing composition at said second temperature and controlling the partial pressure of oxygen in said respective steps such that the partial pressure in said sintering step is not higher than the partial pressure in said other steps.

14. A process as claimed in claim 11, wherein said ceramic superconducting powder consists essentially of $LaBa_2Cu_3O_{7-\delta}$, wherein $\delta$ is the deviation from the stoichiometerical value of said powder.

15. A process as claimed in claim 4, wherein the partial pressure of oxygen in said temperature-elevating step, said temperature-lowering step, and said annealing step, respectively, are controlled to be more than the partial pressure of oxygen in said sintering step.

16. A ceramic superconducting composition consisting essentially of an oxide represented by the formula $LaBa_2Cu_3O_{7-\delta}$ and $Ag_2O$, wherein $\delta$ is the deviation from the stoichiometrical value of said composition and said $Ag_2O$ in said oxide is present at from 10 to 70% by weight per mole of $LaBa_2Cu_3O_{7-\delta}$ being represented by 100, said oxide being prepared by a process comprising the steps of:
   a) mixing a ceramic superconducting powder with a silver oxide powder to obtain a silver-containing mixture;
   b) elevating to a first temperature of 900° C. to 980° C. said silver-containing mixture at a temperature-elevating rate of 200° C. per hour;
   c) sintering said silver-containing mixture at said first temperature;
   d) lowering said first temperature to a second temperature of 300° C. said silver-containing mixture at a temperature-lowering rate of 60° C. per hour; and
   e) annealing said silver-containing mixture at said second temperature to obtain said ceramic superconducting oxide composition;
while controlling the partial pressure of oxygen in the vicinity of said silver-containing mixture in said respective steps.

17. A ceramic superconducting composition as claimed in claim 16, wherein said respective steps are performed while controlling the partial pressure of oxygen so that the partial pressure of oxygen in said sintering step is not higher than the partial pressure in said other steps.

18. A ceramic superconducting composition as claimed in claim 16, wherein said $Ag_2O$ in said oxide is present in the range of 20 to 70% by weight per mole of $LaBa_2Cu_3O_{7-\delta}$ being represented by 100.

19. A ceramic superconducting composition as claimed in claim 16, wherein said $Ag_2O$ in said oxide is present in the range of 20 to 25% by weight per mole of $LaBa_2Cu_3O_{7-\delta}$ being represented by 100.

* * * * *